(12) United States Patent
Inaba et al.

(10) Patent No.: US 6,387,734 B1
(45) Date of Patent: May 14, 2002

(54) SEMICONDUCTOR PACKAGE, SEMICONDUCTOR DEVICE, ELECTRONIC DEVICE AND PRODUCTION METHOD FOR SEMICONDUCTOR PACKAGE

(75) Inventors: Masatoshi Inaba; Takanao Suzuki; Tadanori Ominato; Masahiro Kaizu; Akihito Kurosaka, all of Tokyo (JP)

(73) Assignee: Fujikura Ltd., Tokyo (JP)

(*) Notice: Subject to any disclaimer, the term of this patent is extended or adjusted under 35 U.S.C. 154(b) by 0 days.

(21) Appl. No.: 09/762,681

(22) PCT Filed: Jun. 12, 1999

(86) PCT No.: PCT/JP00/03804

§ 371 Date: May 24, 2001

§ 102(e) Date: May 24, 2001

(87) PCT Pub. No.: WO00/77843

PCT Pub. Date: Dec. 21, 2000

(30) Foreign Application Priority Data

Jun. 11, 1999 (JP) .......................... 11-166090

(51) Int. Cl.[7] .................. H01L 21/44; H01L 21/48; H01L 21/50; H01L 21/4763; H01L 23/12; H01L 23/053; H01L 23/14

(52) U.S. Cl. ................. 438/125; 438/107; 438/618; 257/701; 257/702

(58) Field of Search .................... 438/107, 618; 257/701, 702

(56) References Cited

U.S. PATENT DOCUMENTS 5,527,741 A * 6/1996 Cole et al. ............... 437/209

FOREIGN PATENT DOCUMENTS

JP  2000-228423  8/2000

* cited by examiner

*Primary Examiner*—Charles Bowers
*Assistant Examiner*—Nema Berezny
(74) *Attorney, Agent, or Firm*—Oblon, Spivak, McClelland, Maier & Neustadt, P.C.

(57) ABSTRACT

An insulating layer (3) is formed on a Si wafer (1). An opening portion is made in this insulating layer (3), and subsequently a rerouting layer (2) is formed. Next, a resin layer (4) is formed on the rerouting layer (2). The resin layer (4) is then cured so that the rerouting layer (2) and a Cu foil (5) are bonded to each other through the resin layer (4). Thereafter, a ring-like opening portion (4a) is made in the resin layer (4), and a Cu plating layer (8) is formed inside this opening portion (4a).

15 Claims, 11 Drawing Sheets

(a)

(b)

(c)

(a)

(b)

SEMICONDUCTOR PACKAGE, SEMICONDUCTOR DEVICE, ELECTRONIC DEVICE AND PRODUCTION METHOD FOR SEMICONDUCTOR PACKAGE

TECHNICAL FIELD

The present invention relates to a semiconductor package, such as a wafer level CSP (Chip Size/Scale Package), using no wiring board (interposer), a semiconductor device, an electronic device, and a method for producing the semiconductor package; and particularly to a semiconductor package, a semiconductor device and an electronic device which can be produced with ease, and a method for producing the semiconductor package.

BACKGROUND ART

In recent years, a development of small-sized semiconductor devices has been promoted. With this development, attention is paid to the miniaturization of the packages of these semiconductor devices. For instance, a variety of semiconductor packages have been proposed in the August issue (1998) and February issue (1999) of Nikkei Microdevice. Among these packages, especially a wafer level CSP using a semiconductor package called CSP has a high effect on the miniaturization of a package and a reduction in costs. This CSP is a package resin-sealed together with a wafer. FIG. 15 is a sectional view showing the structure of a conventional CSP. Incidentally, FIG. 15 shows the condition that the above CSP will be mounted on a printed circuit board and the vertically positional relation between the parts explained hereinafter is reversed with respect to those of FIG. 15.

In the conventional CSP, plural electrodes, for example, Al pads 52 are formed on a wafer 51. Also a passivation film, for example, a SiN layer 53 and a polyimide layer 54 which cover the Al pads 52 are formed on the entire surface of the wafer 51. In the SiN layer 53 and the polyimide layer 54, a via hole which reaches the Al pad 52 from the surface of the polyimide layer 54 is formed and a conductive layer 55 is embedded in the via hole. On the polyimide layer 54, a rerouting layer 56 connected to the conductive layer 55 is formed. The rerouting layer 56 is formed of, for example, Cu. A sealing resin layer 57 coating the rerouting layer 56 is formed on the entire surface of the polyimide layer 54. Inside the sealing resin layer 57, a Cu post 58 which reaches the rerouting layer 56 from the surface of the sealing resin layer 57 is formed as a metal post. A barrier metal layer 59 is formed on the Cu post 58 and a solder ball 60 such as a solder is formed on the barrier metal layer 59.

Next, a method for producing the conventional CSP as mentioned above will be explained. FIGS. 16(a) to (e) are sectional views showing the method for producing the conventional CSP in step order. Incidentally, the rerouting layer, the polyimide layer and the like are omitted in FIGS. 16(a) to (e).

Firstly, as shown in FIG. 16(a), a wafer 61 with a flat surface is prepared. As shown in FIG. 16(b), plural Cu posts 62 are formed on the wafer 61 by plating. Next, as shown in FIG. 16(c), all Cu posts 62 are resin-sealed such that they are encased to form a sealing resin layer 63. Then, as shown in FIG. 16(d), the surface of the sealing resin layer 63 is polished to expose each Cu post 62. Thereafter, as shown FIG. 16(e), a solder ball 64 such as a solder is mounted on each Cu post 62.

The CSP as described above is thus formed. This CSP is made into a given size by dicing afterwards.

Since a semiconductor package is in general different from a printed circuit board or the like in thermal expansion coefficient, a stress based on the difference in thermal expansion coefficient focuses on a terminal of the semiconductor package. However, in the above-mentioned CSP, the stress is easily dispersed by making the cylindrical Cu post 62 have a large height.

However, in order to disperse the stress based on the difference in thermal expansion coefficient, it is necessary for a metal post, such as a Cu post, to have a height as large as about 100 $\mu$m from the rerouting layer. However, if a metal post having such a height is formed by plating, there is a problem that a remarkable long period of time is required. This further gives rise to the problems of increased production cost and a difficulty in control of the height of the metal post.

In light of such problems, the present invention has been made. It is an object of the present invention to provide a semiconductor package, a semiconductor device and an electronic device which make it possible to disperse a stress produced when the package is mounted on a printed circuit board or the like and which can be produced for a short time, and a method for producing the semiconductor package.

DISCLOSURE OF THE INVENTION

A semiconductor package according to the present invention comprises: an insulating layer formed on a wafer that is provided with an electrode; a rerouting layer penetrating through said insulating layer, the one end of said rerouting layer being connected to said electrode; a sealing resin layer which seals said wafer, said insulating layer and said rerouting layer; a columnar resin material which is defined by making a ring-like opening portion in a resin layer constituting said sealing resin layer-and which is formed on said rerouting layer; and a conductive layer which is formed around said columnar resin material to cover said columnar resin material and which penetrates through said sealing resin layer to conduct electricity between a solder bump and the other end of said rerouting layer.

The present invention is provided with the columnar resin material covered with the conductive layer for conducting electricity between the solder bump and the other end of the rerouting layer, and the post is composed of the columnar resin layer and the conductive layer. This portion acts as a stress-relieving portion. Therefore, in the case that stress is generated in this portion, the stress is dispersed mainly by the columnar resin material. For this reason, no thick plating layer is necessary for the post. As a result, the process of the production is shortened. Since the height of the post can be controlled by the height of the columnar resin material, the adjustment thereof is easy.

The stress can be concentrated still more into the post by forming a resin layer having an opening portion formed only on a portion of said conductive layer, said portion covering an upper surface of said columnar resin material on said sealing resin layer.

Moreover, the damage of the rerouting layer when the ring-like opening portion is made can be reduced by forming a metal layer having a higher reflectivity against a laser used when said ring-like opening portion is formed than said rerouting layer on said rerouting layer and at least at a position conformable to said ring-like opening portion.

Another semiconductor package according to the present invention comprises a wafer that is provided with an electrode; and a post formed on said wafer, wherein said post comprises a resin material and a conductive layer formed at least on an upper surface of said resin material, a spherical solder bump is formed on said conductive layer positioned on an upper surface of said post, and the central position of said solder bump is consistent with the central position of said post as are viewed in plan.

In the present invention, since the post is provided with the conductive layer and the resin material, stress acting on this post is relieved by the resin material. Since the central position of the solder bump is consistent with the central position of the post as are viewed in plan, the stress is substantially uniformly dispersed and the distribution thereof is made uniform.

The electrode and the conductive layer may be connected to each other, and a part of the conductive layers may not be connected to the electrode. In other words, a part of the conductive layers are not connected to the electrode, and the post having the conductive layer is formed only to disperse the stress in the whole of the package uniformly.

The semiconductor device provided with any one of the above-mentioned semiconductor packages according to the present invention comprises an integrated circuit formed in the wafer.

The electronic device provided with this semiconductor device according to the present invention comprises a circuit board connected to the solder bump.

A method for producing a semiconductor package according to the present invention comprises the steps of: forming an insulating layer on a wafer that is provided with an electrode; forming a rerouting layer penetrating through said insulating layer, the one end of said rerouting layer being connected to said electrode; forming a sealing resin layer on the entire surface; making a ring-like opening portion reaching said rerouting layer in said sealing resin layer; forming a conductive layer from inside of said opening portion to upper side of said sealing resin layer, thereby making a shape that said sealing resin layer remaining inside said opening portion is covered with said conductive layer; and forming a solder bump on said conductive layer.

By using a laser to nake the opening portion, the side surface of the remaining resin layer is inclined toward the surface thereof. Thus, it is easy to form the conductive layer afterwards.

The sealing resin layer may be composed of a photosensitive resin, and the step of making the opening portion may be a step of making the opening portion by photolithography.

BEST MODE FOR CARRYING OUT THE INVENTION

A method for producing a semiconductor package according to embodiments of the present invention will be hereinafter explained in detail with reference to the appended drawings. FIGS. 1(a) to (c), FIGS. 2(a) to (c), and FIG. 3 are sectional views showing a method for producing a semiconductor package according to a first embodiment of the present invention in step order.

Figure 1:
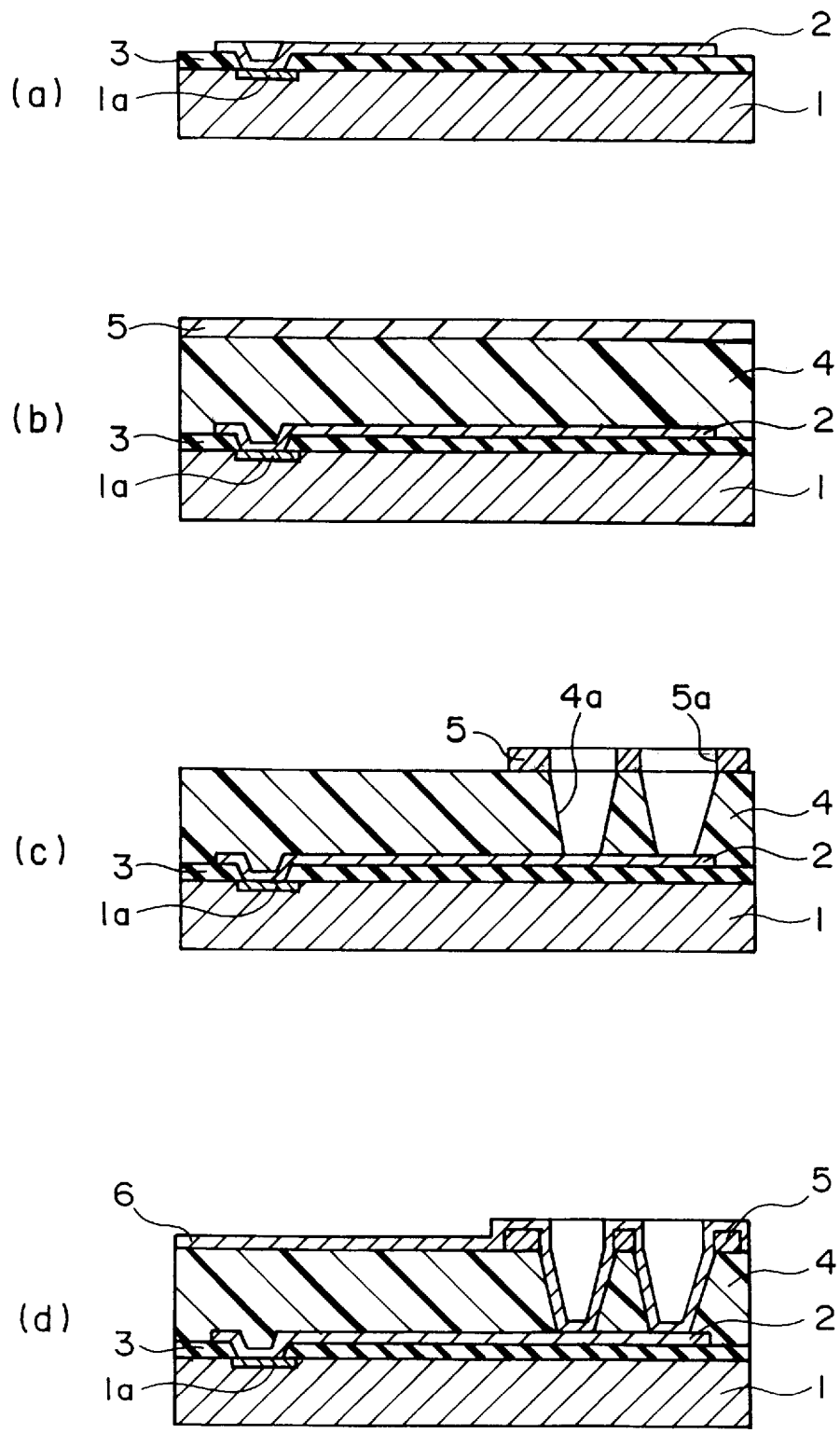
FIGS. 1(a) to (d) are sectional views showing a method for producing a semiconductor package according to a first embodiment of the present invention in step order.

In the present embodiment, as shown in FIG. 1(a), a resin insulating layer 3 is first formed on a Si wafer 1 that is provided with a patterned integrated circuit (not shown) and an electrode 1a thereof. An opening portion is made at the position conformable to the electrode 1a in this insulating layer 3. Next, a rerouting layer 2 connected to the electrode 1a through the opening portion is formed into a wiring path pattern on the insulating layer 3. The rerouting layer 2 is a conductive layer, and is made of, for example, a Cu layer having a thickness of 5 μm. The rerouting layer 2 is also a wiring path for connecting a post and the electrode 1a to each other.

As shown in FIG. 1(b), thereafter, a resin layer 4 is formed on the rerouting layer 2 by printing method, laminating method, coating (spin coating) method or the like. The resin layer 4 is made of, for example, a thermoplastic polyimide, and the thickness thereof ranges, for example, from 25 to 100 μm. A Cu foil 5 is attached onto the resin layer 4. The Si wafer 1, on which the rerouting layer 2 is formed, the resin layer 4, and the Cu foil 5 are laminated by thermo compression bonding.

The step shown in FIG. 1(b) may be as follows. A resin film made of a thermoplastic polyimide is prepared separately from the Si wafer 1, and a Cu foil is attached onto the resin film. In the case that the thickness of the resin film is, for example, about 10 μm, the thickness of the Cu foil is about 70 μm. In the case that the thickness of the resin film is from about 30 to 50 μm, the thickness of the Cu foil is from about 30 to 50 μm. However, the. thickness of the resin film and the Cu foil is not limited to the above-mentioned range. Products having a thickness corresponding to their design specification are commercially available. Next, the resin film is thermally compressed and bonded onto the rerouting layer 2. Namely, the resin film is cured by being heated, so that the rerouting layer 2 and the Cu foil are bonded to each other through the resin film.

Next, as shown in FIG. 1(c), the Cu foil 5 is dotted in the form of an island on the post by etching the Cu foil. A ring-like opening portion 5a is made in each of the dotted Cu foils 5. By etching the resin layer 4 inside this ring with a laser using the Cu foil 5 as a mask, a ring-like opening portion 4a is made. The spot of the laser is positioned in the island-form Cu foil 5 and no laser is radiated outside the Cu foil 5. By this step, the following control can be attained: the side wall of the opening portion 4a is inclined inwards toward a deeper site, and the opening portion 4a becomes narrower toward a deeper site. Therefore, the resin layer 4 whose section is tapered (truncated cone) remains at the center of the opening portion 4a. The area of the section becomes wider from the side of the Cu foil 5 toward the edge of the rerouting layer 2. This resin layer 4 is columnar. This portion is a columnar resin material. The side surface of the resin layer 4, remaining at the center of the opening portion 4a, can be observed as is viewed in plan. The wording "as is viewed in plan" means "when is viewed from the upper side of the surface of the wafer". As the laser, for example, an excimer laser, a $CO_2$ layer, a UV-YAG laser or the like may be used. The etching is not limited to etching with the laser, and may be anisotropic plasma etching, using, for example, $CF_4$ plasma. The rerouting layer can be made of a metal multilayer having a high reflectivity against the laser. This multilayer will be described later.

Next, as shown in FIG. 1(d), a thin seed layer 6 for electrolytic plating is formed on the entire surface. This seed layer 6 is, for example, a laminate formed by a sputtering method, for example, and either consisting of a Cu layer and a Cr layer or consisting of a Cu layer and a Ti layer. The seed layer 6 may be an electroless Cu plating layer or a metal thin layer formed by vapor deposition method, spin coating method, chemical vapor deposition (CVD) method or the like; or a combination of these layers. The seed layer may be a combination of these layers.

Figure 2:
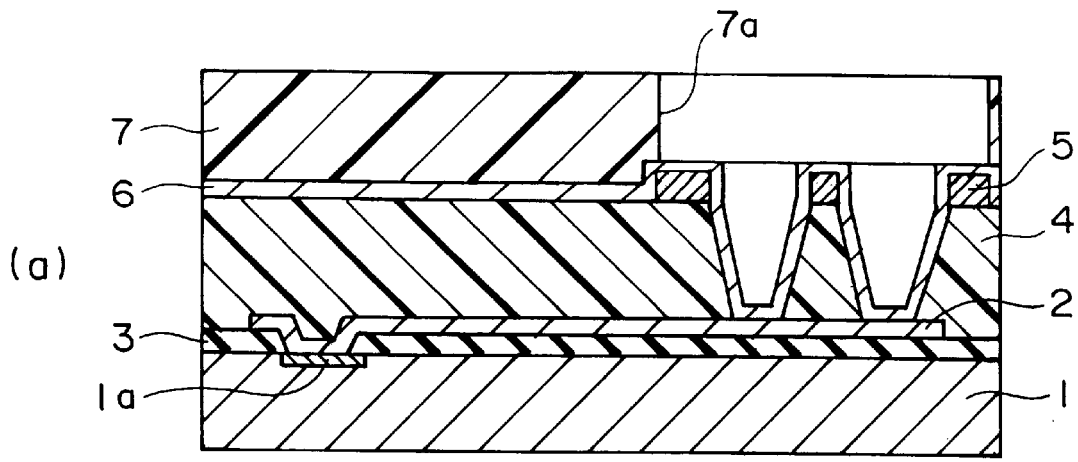
FIGS. 2(a) to (c) are also views showing the method for producing the semiconductor package according to the first embodiment of the present invention, the views being sectional views showing steps subsequent to the steps shown in FIG. 1.
Figure 2:
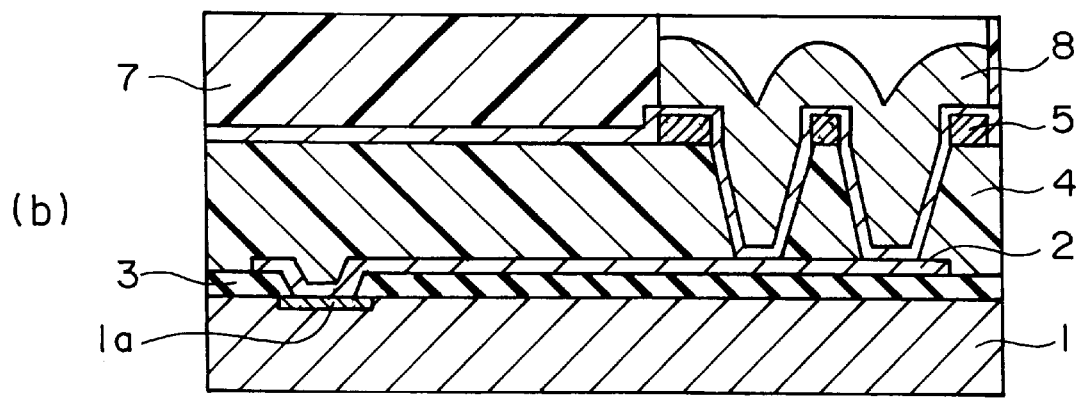
Figure 2:
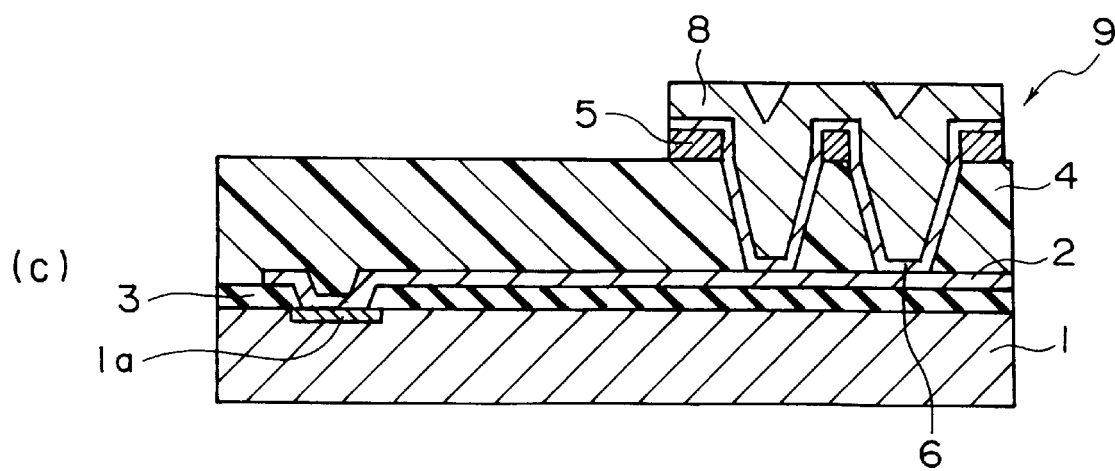

Next, as shown in FIG. 2(a), a resist layer 7 for electrolytic plating is formed on the seed layer 6. This resist film 7 has an opening portion 7a made in the area conformable to the opening portion 4a and the periphery thereof. The resist film 7 can be formed by, for example, lamination of a film resist or coating of a liquid resist.

Thereafter, as shown in FIG. 2(b), a Cu plating layer 8 is formed on the seed layer 6 that is exposed, using the resist film 7 as a mask, by electrolytic copper plating. The thickness of the Cu plating layer 8 ranges, for example, from 5 to 50 μm. In this case, it is unnecessary that the Cu plating layer 8 is completely embedded in the opening portion 4a. It is sufficient that the opening portion 4a has such an area and unevenness that satisfy properties necessary for a solder bump that will be formed afterwards. Thereafter, for example, a Ni plating layer and a Au plating (not shown) may be formed on the Cu plating layer 8 to improve wettability of a solder bump that will be formed later.

Subsequently, as shown in FIG. 2(c), the resist film 7 is exfoliated, and the unnecessary seed 6 which is bare is removed by etching. In this way, a post 9 is formed on the Si wafer.

Figure 3:
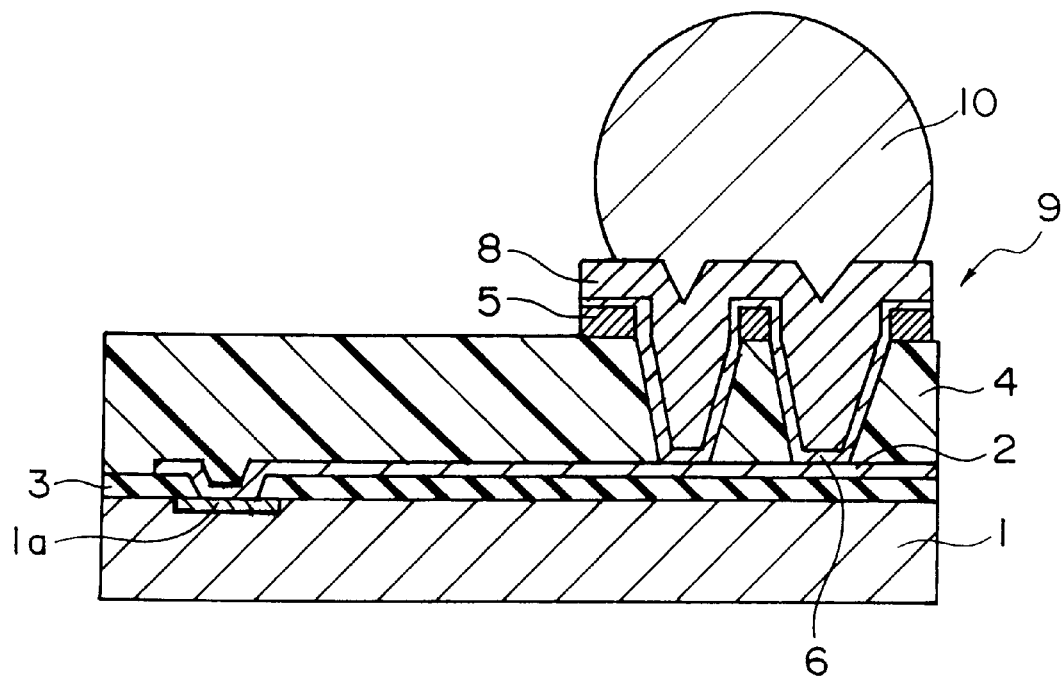
FIG. 3 is also a view showing the method for producing the semiconductor package according to the first embodiment of the present invention, the views being sectional views showing steps subsequent to the steps shown in FIG. 2.

Thereafter, as shown in FIG. 3, a spherical solder bump (solder ball) 10 is formed on the surface of the post 9. Examples of this formation method include plating, printing and metal jetting methods, and a method of putting the solder ball onto the post. At this time, it is desired that the central position of the solder bump 10 is made consistent with the central position of the post 9, which is also the center of the columnar resin material, as are viewed in plan.

The post 9 of the thus produced semiconductor package has a shape as shown in FIG. 2(c). In other words, the post 9 has such a shape that the columnar resin layer 4 is embedded (or fitted) in hollow portion of the cylindrical Cu plating layer 8. Therefore, in the case that the package is mounted on a printed circuit board and mechanical stress is generated, the stress is dispersed by not only the Cu plating layer 8 but also the resin layer 4 present inside the cylinder. The effect of the stress-dispersion is greater as the central position of the solder bump 10 and the central position of the post 9 are nearer to each other, as are viewed in plan. This effect is greatest when the central positions are consistent with each other. This is because the stress is uniformly dispersed in almost all directions to make the stress distribution uniform if the central position of the solder bump 10 and the central position of the post 9 are consistent with each other, as are viewed in plan.

Since the center of the post 9 is made of the flexible resin material, the above-mentioned effect is still better.

As described above, according to the present embodiment, ensuring electrical conduction and the dispersion of the stress are possible even if there is no plating layer whose thickness is as thick as 100 μm. The semiconductor package can be produced for a short time, and costs for the production can be reduced. The height of the post 9 can be controlled by the height of the resin layer 4. Thus, the control is easy.

In the case that, after the seed layer 6 and the Cu plating layer 8 are etched, the unevenness made in the surface of the Cu plating layer 8 is large so that it is difficult to form the solder bump having necessary shape and height, the surface may be polished before the formation of the solder bump. If the surface is flat, it is easy to control the height and area of the solder bump put thereon. The material of the resin layer disposed inside the post is not limited to any polyimide. If a material makes it possible to disperse the stress, the material can be used.

Specifically, it is possible to use, for example, an epoxy resin, a silicone resin or the like.

As shown in FIG. 1(c), in the first embodiment, the Cu foil 5 used as a mask is etched to remain in a ring-like form. However, if the ring-like opening portion 5a can be formed, the Cu foil 5 may be caused to remain to extend other areas. In this case, it is necessary to etch the Cu foil 5 in the manner that the electrodes on the posts are independent of each other in the next step.

Figure 4:
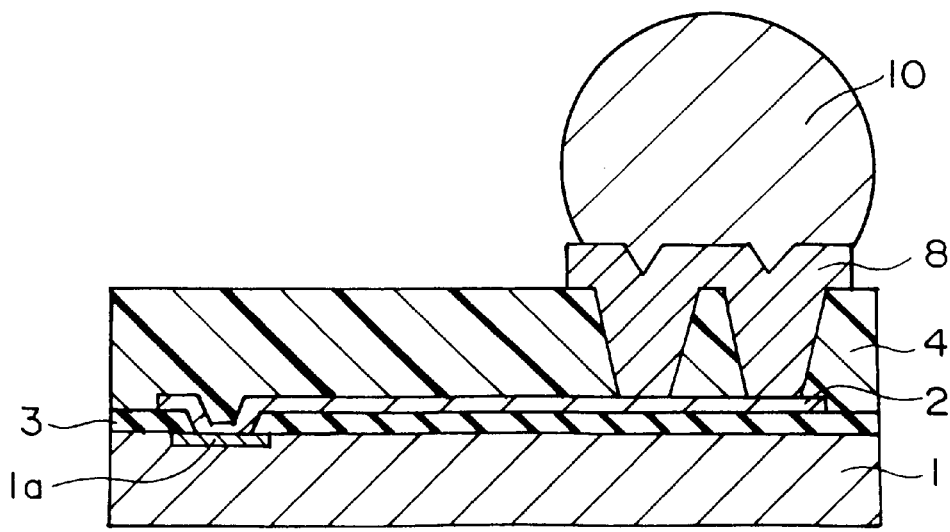
FIG. 4 is a sectional view showing a semiconductor package produced according to a second embodiment of the present invention.
Figure 5:
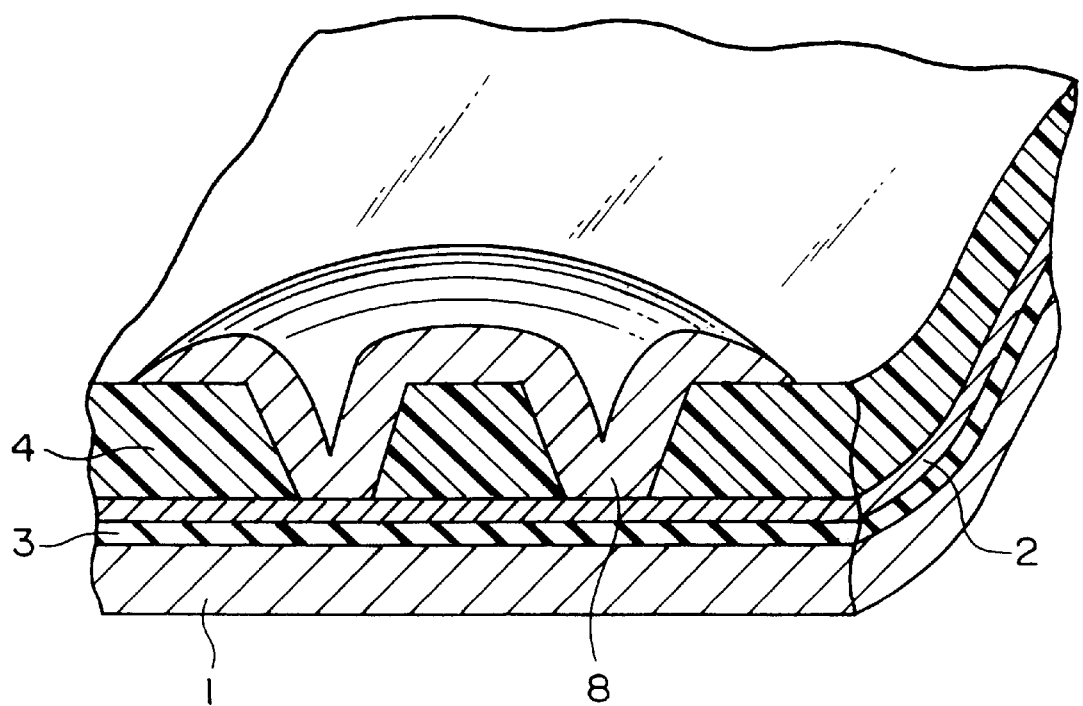
FIG. 5 is a partially sectional view also showing an actual semiconductor package produced according to the second embodiment of the present invention.

The following will describe a second embodiment. FIG. 4 is a sectional view showing a semiconductor package produced according to the second embodiment of the present invention. FIG. 5 is a partially sectional view also showing an actual semiconductor package produced according to the second embodiment of the present invention. In the second embodiment shown in FIGS. 4 and 5, to the same constituents as in the first embodiment shown in FIG. 3 are attached the same reference numbers and detailed explanation thereof is omitted. In FIGS. 4 and 5, the seed layer is omitted.

In the second embodiment, after the resin layer 4 is formed in the same way as in the first embodiment, the ring-like opening portion 4a is directly made in the resin layer 4 without the Cu foil layer 5 being attached. This opening portion 4a can be made, for example, by radiating a laser beam onto the resin layer 4, without using any mask, while moving the laser beam by program control in the manner that a circle having a larger diameter than the diameter of the beam is drawn. A metal mask may be used to perform processing in a lump. It is allowable to make the resin layer 4 of a photosensitive resin and then make the opening portion 4a in the resin layer 4 by photolithography. The method for forming the opening portion 4a is not limited to these methods.

After the formation of the ring-like opening portion 4a, a semiconductor package can be completed by performing the same steps as in the first embodiment, including the formation of the seed layer (not shown).

According to the second embodiment, while it is necessary to keep the height of the post by the Cu plating layer 8, the step of forming the Cu foil 5 is unnecessary as is compared with the first embodiment. Thus, the number of the process is reduced.

Figure 6:
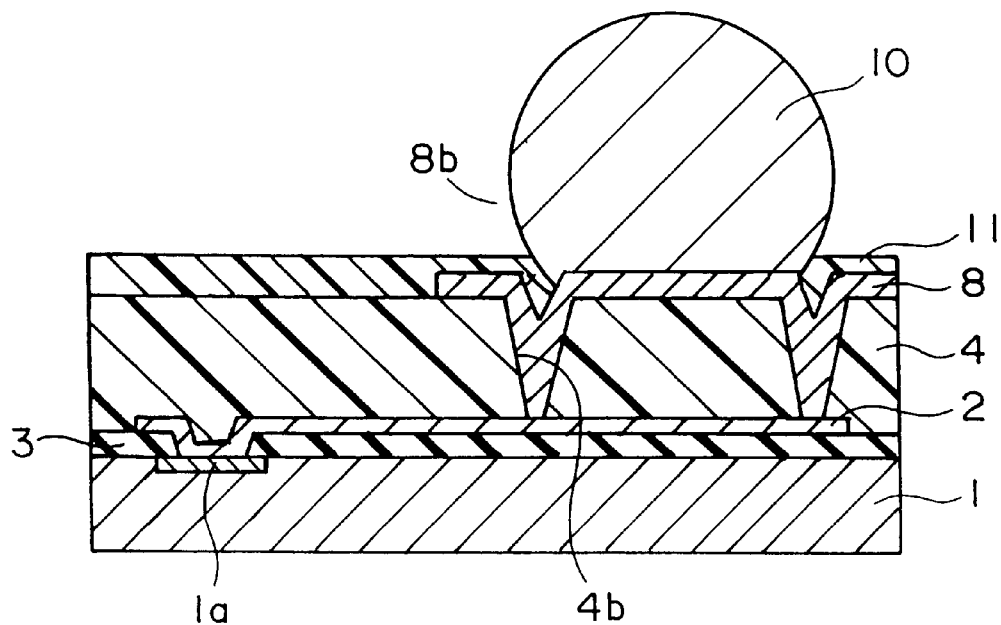
FIG. 6 is a sectional view showing a semiconductor package produced according to a third embodiment of the present invention.

The following will describe a third embodiment. FIG. 6 is a sectional view showing a semiconductor package produced according to the third embodiment of the present invention. In the third embodiment shown in FIG. 6, to the same constituents as in the second embodiment shown in FIG. 4 are attached the same reference numbers and detailed explanation thereof is omitted. In the present embodiment, however, in order to clarify the relationship between the lower surface of the solder ball and the contact surface of the post, the central portion of the post is enlarged more exaggeratingly than in the drawings showing the respective embodiments, and is shown. In FIG. 6, the seed layer is omitted.

After an opening portion 4b is made, the seed layer (not shown) and the Cu plating layer 8 are formed. Next, a resin layer 11 having an opening portion above the resin layers 4 present in an island-like form inside the opening portion 4b is formed. At this time, a ring-like groove 8b is present in the Cu plating layer 8, the groove 8b being a groove having such a shape that the shape of the opening portion 4b is transcribed, that is, a groove surrounding the island made of the resin. The resin layer 11 is formed to be embedded in this groove 8b. The resin layer 11 can be made of, for example, a solder resist.

The solder bump 10 is then formed on the Cu plating layer 8 that is bare from the opening portion in the resin layer 11.

According to the third embodiment, the resin layer 11 is embedded in the groove 8b made in the Cu plating layer 8 when the solder bump 10 is formed. It is therefore possible to prevent the solder for forming the solder bump 10 from flowing into this groove 8b. Thus, the solder bump 10 can easily be made from a decided amount of solder into a sphere because the solder amount of a single solder ball is substantially decided. As a result, the solder bump can be made to have a large height. By making the shape of the solder bump 10 into a true sphere as much as possible, a distance between the wafer and a circuit board can be wider. As a result, it is possible to relieve the stress genera ted in the circuit board and the wafer, and further perform subsequent joint with the circuit board easily.

Figure 7:
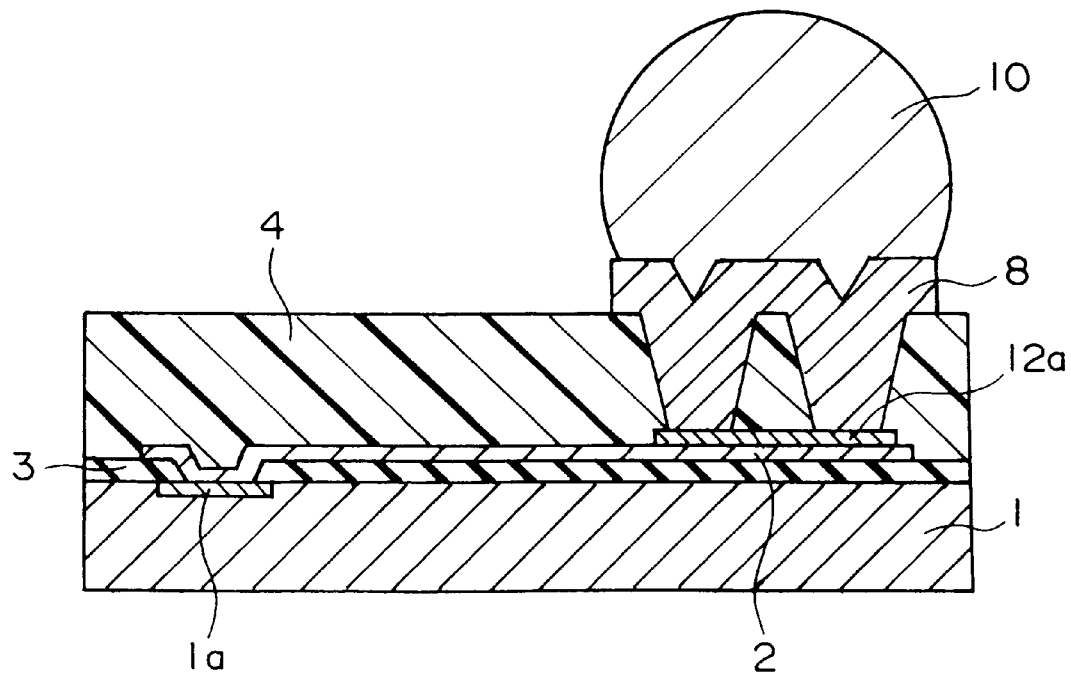
FIG. 7 is a sectional view showing a semiconductor package produced according to a fourth embodiment of the present invention.

The following will describe a fourth embodiment. FIG. 7 is a sectional view showing a semiconductor package produced according to the fourth embodiment of the present invention. In the fourth embodiment shown in FIG. 7, to the same constituents as in the second embodiment shown in FIG. 4 are attached the same reference numbers and detailed explanation thereof is omitted. The seed layer is also omitted in FIG. 7.

In the fourth embodiment, before the resin layer 4 is formed, a metal layer 12a having a high reflectivity against a laser is formed on regions where posts of the rerouting layer 2 are to be formed. In the case that, for example, a YAG laser, whose wavelength is 355 nm, is used and the rerouting layer 2 is made of Cu, the metal layer 12a can be made of a mono-layer or a multilayer of Au, Ag, Ni, Cr or the like. The thickness of the rerouting layer 2 is, for example, 5 $\mu$m, and the thickness of the metal layer 12a is, for example, 1 $\mu$m or less.

After the metal layer 12a is formed, the same steps as in the second embodiment are performed to complete a semiconductor package.

According to the fourth embodiment, the damage of the rerouting layer 2 based on the laser can be prevented even if the laser is used at the time of the formation of the opening portion 4a.

Figure 8:
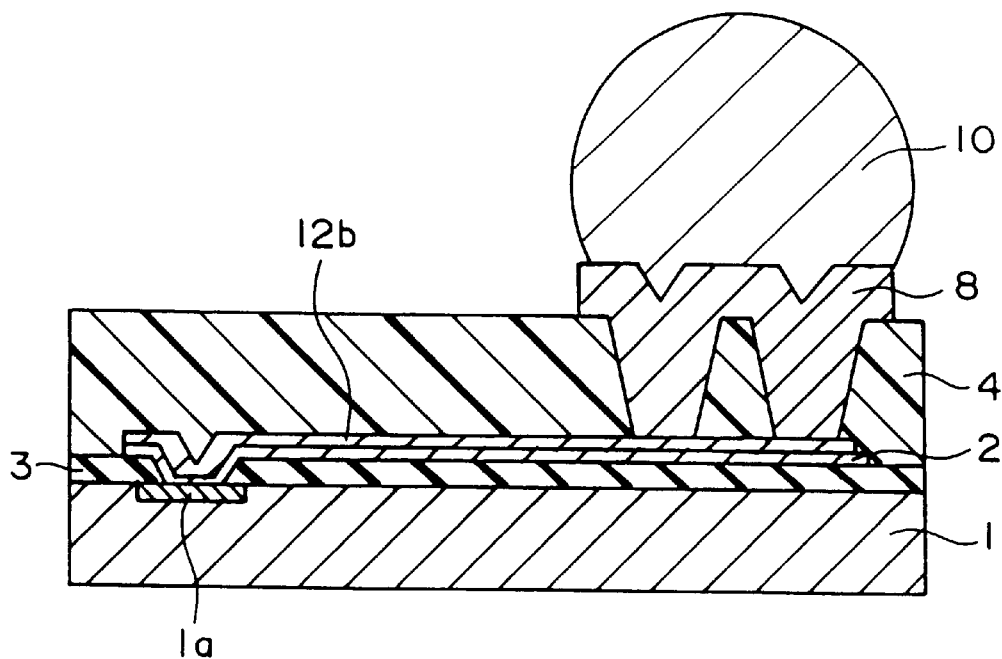
FIG. 8 is a sectional view showing a semiconductor package produced according to a fifth embodiment of the present invention.

The metal layer may be formed not only on the regions where the posts are to be formed but also on the entire surface of the rerouting layer. FIG. 8 is a sectional view showing a semiconductor package produced according to a fifth embodiment of the present invention. In the fifth embodiment shown in FIG. 8, to the same constituents as in the second embodiment shown in FIG. 4 are attached the same reference numbers and detailed explanation thereof is omitted. The seed layer is also omitted in FIG. 8.

In the fifth embodiment, the metal layer 12b is formed on the entire surface of the rerouting layer 2. The same steps as in the second embodiment are performed to produce a semiconductor package.

According to the fifth embodiment, the damage of the rerouting layer 2 based on the laser can be prevented.

The material of the metal layer is not limited to the above-mentioned Au, Ag, Ni or Cr, and can be appropriately selected dependently on the wavelength of the used laser and the material of the rerouting layer.

Figure 9:
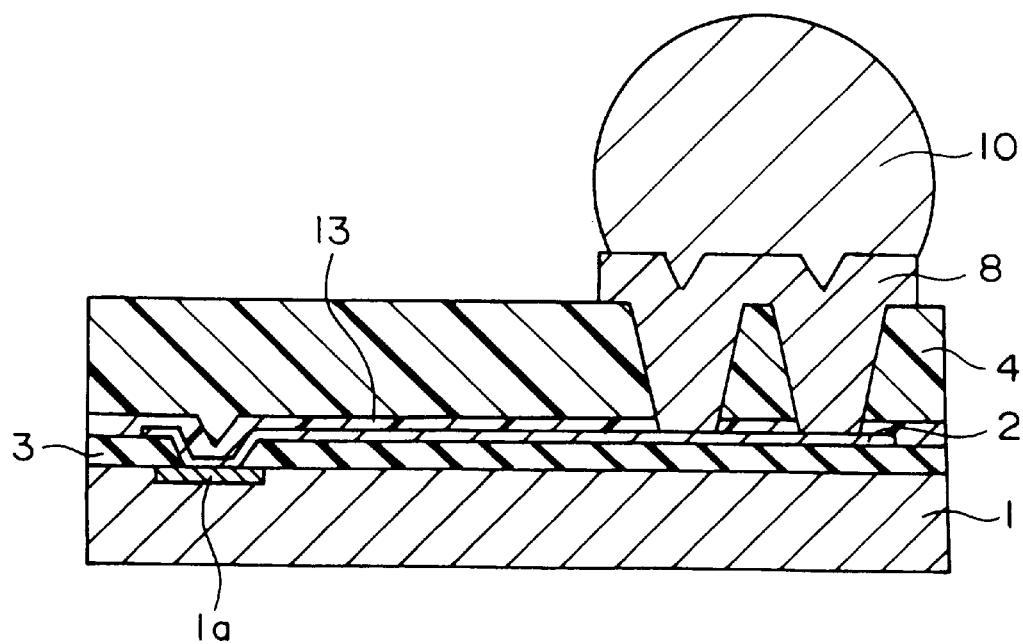
FIG. 9 is a sectional view showing a semiconductor package produced according to a sixth embodiment of the present invention.

The following will describe a sixth embodiment. FIG. 9 is a sectional view showing a semiconductor package produced according to the sixth embodiment of the present invention. In the sixth embodiment shown in FIG. 9, to the same constituents as in the second embodiment shown in FIG. 4 are attached the same reference numbers and detailed explanation thereof is omitted. The seed layer is also omitted in FIG. 9.

In the sixth embodiment, after the rerouting layer 2 is formed, a thin resin film 13 is formed on the entire surface. The thickness of the resin film 13 is from about 1 to about 10 $\mu$m, and is substantially the same as the rerouting layer, for example, 5 $\mu$m. The resin film can be formed, for example, by spin-coating a polyimide resin. After the resin film 13 is formed, the same steps as in the second embodiment are performed, for example, to form the resin layer 4. Thus, a semiconductor package is completed.

According to the sixth embodiment, the resin film 13 is formed on the entire surface at the time of the formation of the resin layer 4. Therefore, it is possible to flatten unevenness, in electrode portions, present when the rerouting layer 2 is completed and unevenness, in portions extended from the electrodes, at both sides of the rerouting layer 2. As a result, it is possible to prevent inconveniences, such as floating and taking-in of bubbles, which may be generated at step portions based on the unevenness in the electrode portions and the unevenness, in the portions extended from the electrodes, at both the sides of the rerouting layer 2, and which may be generated when the resin layer 4 is formed. Accordingly, the adhesive strength between the wafer and the resin layer 4 is improved so that the reliability, over a long period, of the whole of the semiconductor package is improved.

Figure 10:
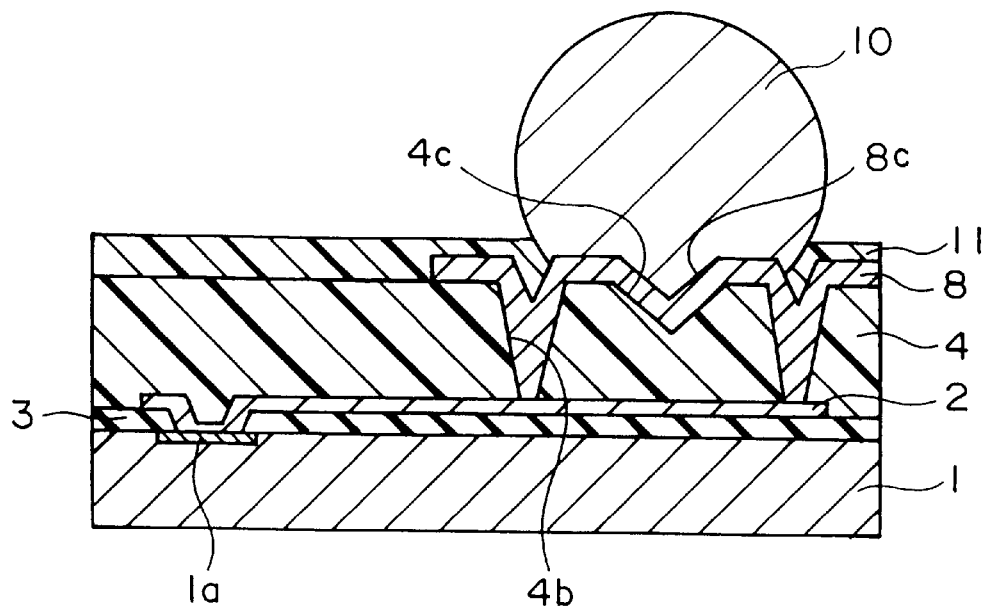
FIG. 10 is a sectional view showing a semiconductor package produced according to a seventh embodiment of the present invention.

The following will describe a seventh embodiment. FIG. 10 is a sectional view showing a semiconductor package produced according to the seventh embodiment of the present invention. In the seventh embodiment shown in FIG. 10, to the same constituents as in the third embodiment shown in FIG. 6 are attached the same reference numbers and detailed explanation thereof is omitted. The seed layer is also omitted in FIG. 10.

In the seventh embodiment, at the same time of forming the opening portion 4b after the resin layer 4 is formed, a single concave 4c is made at the center of the island-like portion, which is caused to remain at the center of the opening portion. Next, the Cu plating layer 8 is formed in the same manner as in the third embodiment. A concave 8c, which has such a shape that the shape of the concave 4c, not the opening portion 4b, is transcribed, is made in the Cu plating layer 8. Thereafter, the same steps as in the third embodiment are performed, for example, to form the resin layer 11. Thus, a semiconductor package is completed.

According to the seventh embodiment, the contacting area between the solder bump 10 and the Cu plating layer 8 is larger than that in the third embodiment. Thus, the bonding strength is heightened, so that the reliability is improved.

Figure 11:
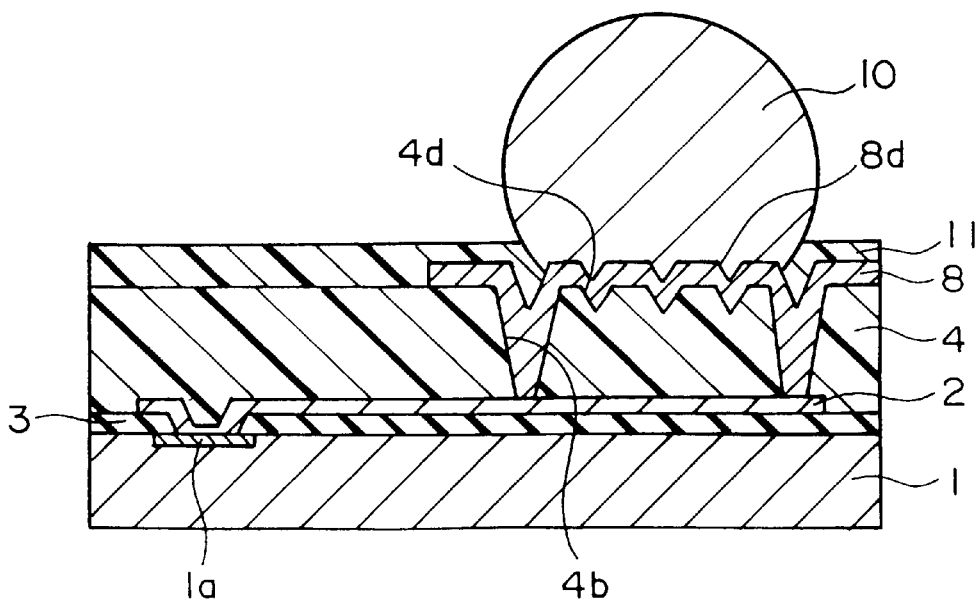
FIG. 11 is a sectional view showing a semiconductor package produced according to an eighth embodiment of the present invention.

The following will describe an eighth embodiment. FIG. 11 is a sectional view showing a semiconductor package produced according to the eighth embodiment of the present invention. In the eighth embodiment shown in FIG. 11, to the same constituents as in the third embodiment shown in FIG. 6 are attached the same reference numbers and detailed explanation thereof is omitted. The seed layer is also omitted in FIG. 11.

In the eighth embodiment, at the same time of forming the opening portion 4b after the resin layer 4 is formed, plural concaves 4d are made at plural sites in the island-like portion, which is caused to remain at the center of the opening portion. Next, the Cu plating layer 8 is formed in the same manner as in the third embodiment. Concaves 8d, each of which has such a shape that the shape of each of the concaves 4d, not the opening portion 4b, is transcribed, are made in the Cu plating layer 8. Thereafter, the same steps as in the third embodiment are performed, for example, to form the resin layer 11. Thus, a semiconductor package is completed.

According to the eighth embodiment, in the same way as in the seventh embodiment, the contacting area between the solder bump 10 and the Cu plating layer 8 is larger than that in the third embodiment. Thus, the bonding strength is heightened, so that the reliability is improved.

Figure 12:
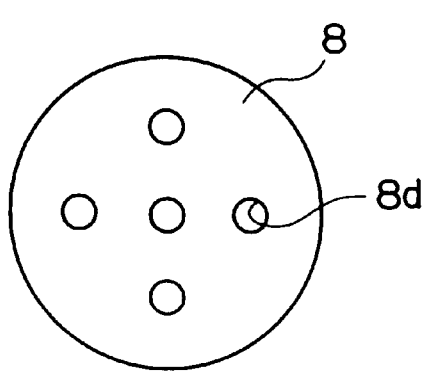
FIG. 12(a) is a schematic plan view showing concaves 8d made in a Cu plating layer 8 in the eighth embodiment.
FIG. 12(b) is a schematic plan view showing another example of the concaves made in the Cu plating layer 8.
Figure 12:
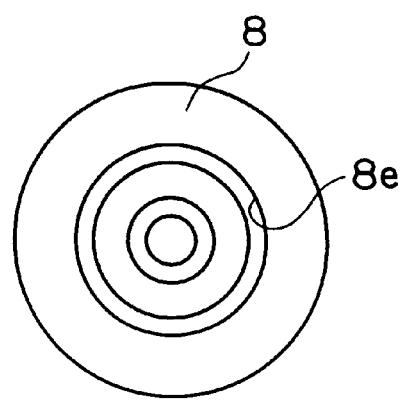

FIG. 12(a) is a schematic plan view showing the concaves 8d made in the Cu plating layer 8 in the eighth embodiment, and FIG. 12(b) is a schematic plan view showing another example of the concaves made in the Cu plating layer 8.

In the eighth embodiment, as shown in FIG. 12(a), the concaves 8d are made to be scattered. In the same way as in the eighth embodiment shown in FIG. 12(a), the effect of the improvement in the bonding strength and the reliability can be obtained in the case that plural concaves 8e are concentrically made in the Cu plating layer 8 as shown in FIG. 12(b).

Figure 13:
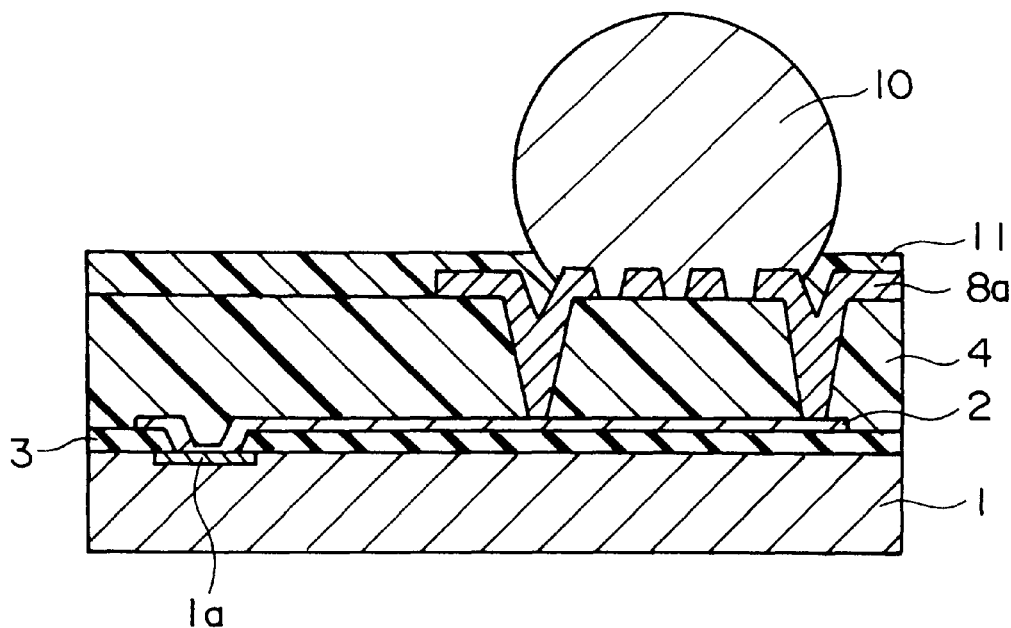
FIG. 13 is a sectional view showing a semiconductor package produced according to a ninth embodiment of the present invention.

The following will describe a ninth embodiment. FIG. 13 is a sectional view showing a semiconductor package produced according to the ninth embodiment of the present invention. In the ninth embodiment shown in FIG. 13, to the same constituents as in the third embodiment shown in FIG. 6 are attached the same reference numbers and detailed explanation thereof is omitted. The seed layer is also omitted in FIG. 13.

In the ninth embodiment, the opening portion 4b is made, and subsequently the seed layer (not shown) and the Cu plating layer 8a are formed. However, when the Cu plating layer 8a is formed, a resist film (not shown) is formed in the manner that this film surrounds the periphery of the Cu plating layer 8a and scatters, in the form of islands, on the resin layer 4 present in the form of an island inside the opening portion 4b. Using this resist film as a mask, for example, electrolytic copper plating is performed. Thereafter, the same steps as in the third embodiment are performed, for example, to form the resin layer 11 having the opening portion. Thus, a semiconductor package is completed.

According to the ninth embodiment, as shown in FIG. 13, plural opening portions (non-plated portion) are present, on the resin layer 4 present in the form of an island inside the opening portion 4b, in the Cu plating layer 8a. Therefore, the contacting area between the solder bump 10 and the Cu plating layer 8a is wider than that in the third embodiment. As a result, the bonding strength is heightened and the reliability is improved.

In the ninth embodiment, the resist film is scattered in the form of islands on the resin layer 4 present in the form of islands inside the opening portion 4b. However, plural resist films may be concentrically formed to make ring-like non-plated portions as shown in FIG. 12(b).

Figure 14:
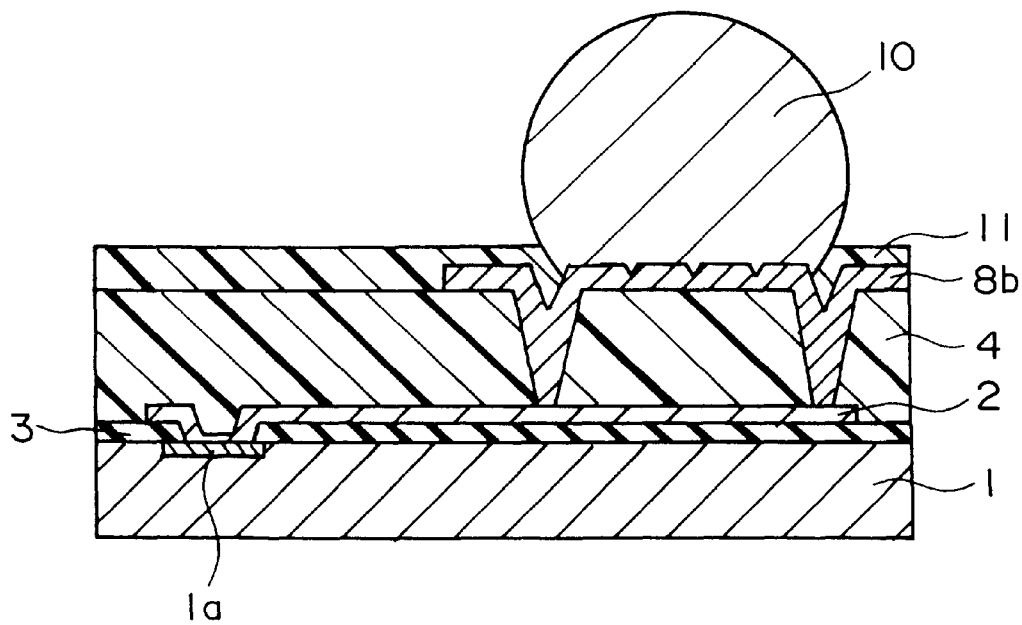
FIG. 14 is a sectional view showing a semiconductor package produced according to a tenth embodiment of the present invention.
Figure 15:
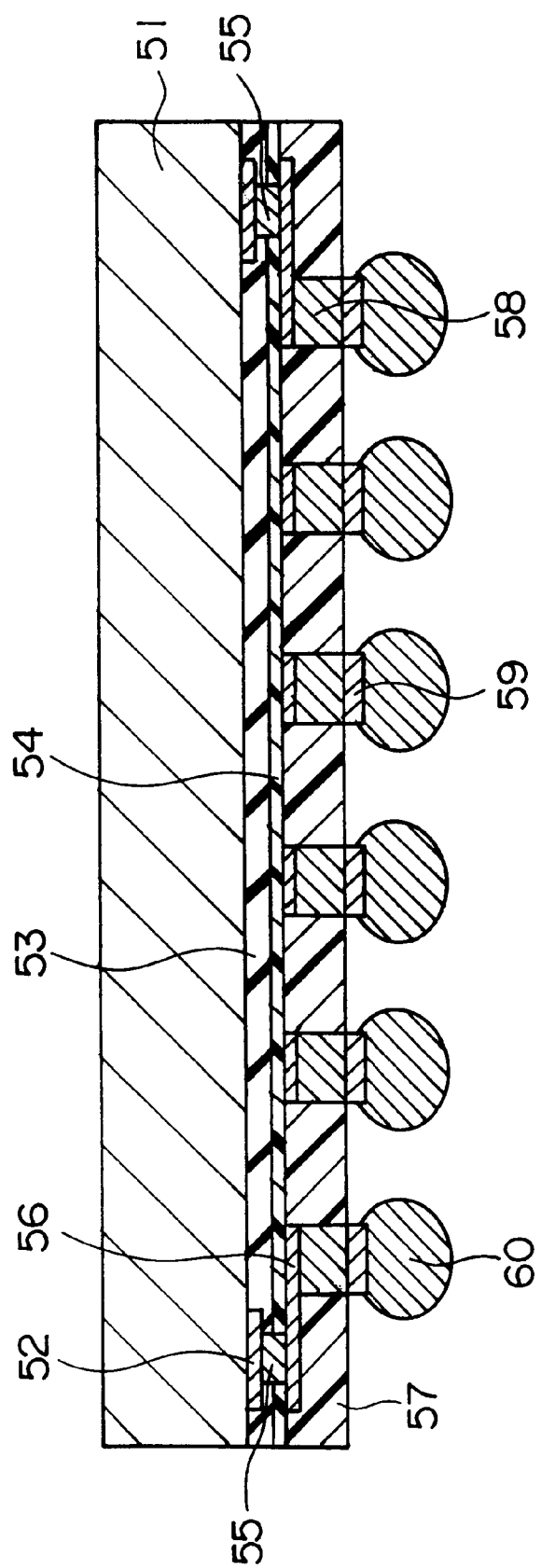
FIG. 15 is a sectional view showing the structure of a conventional CSP.
Figure 16:
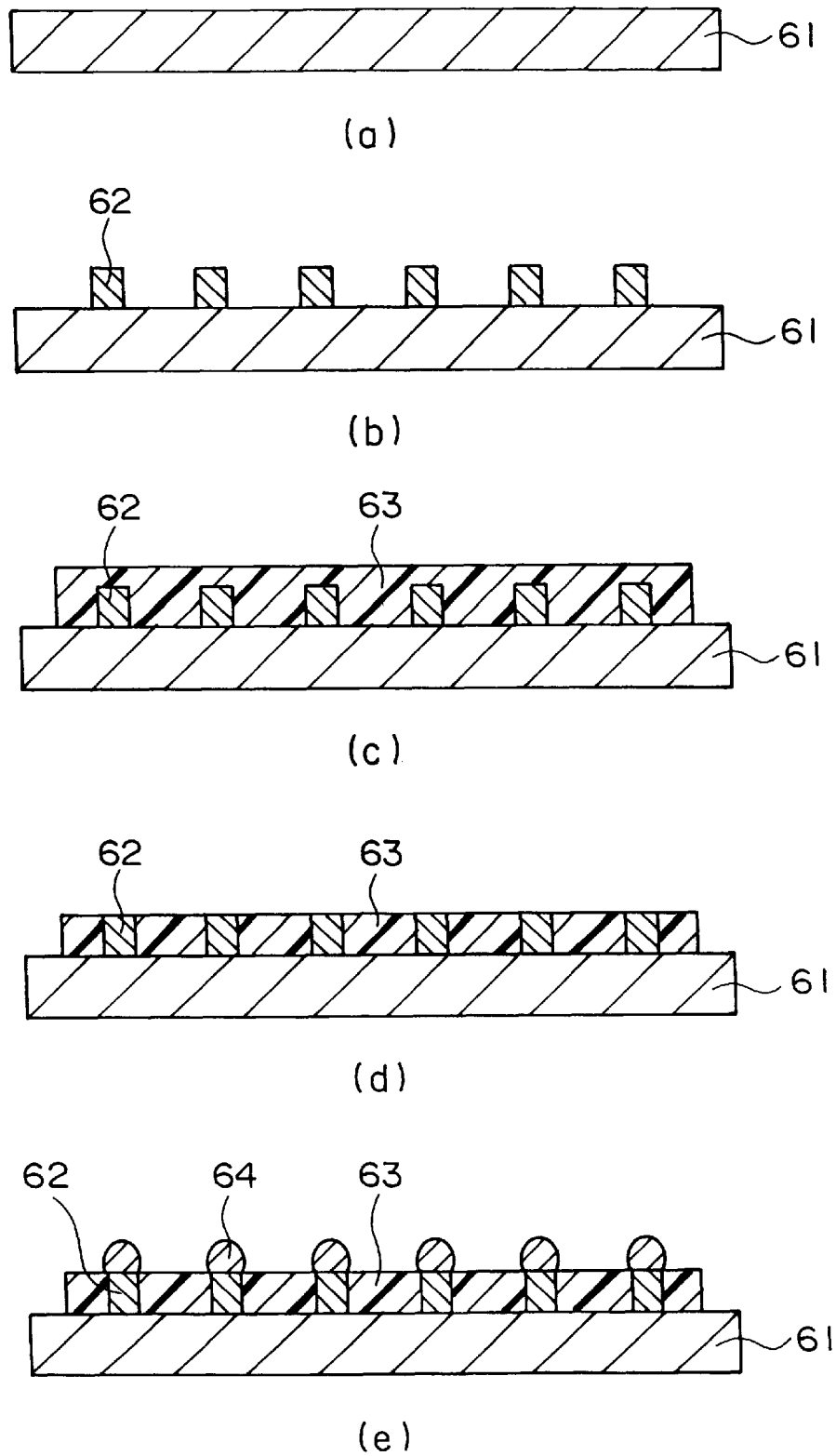
FIGS. 16(a) to (e) are sectional views showing a method for producing the conventional CSP in step order.

The following will describe a tenth embodiment. FIG. 14 is a sectional view showing a semiconductor package produced according to the tenth embodiment of the present invention. In the tenth embodiment shown in FIG. 14, to the same constituents as in the third embodiment shown in FIG. 6 are attached the same reference numbers and detailed explanation thereof is omitted. The seed layer is also omitted in FIG. 14.

In the tenth embodiment, the opening portion 4b is made, and subsequently the seed layer (not shown) and the Cu plating layer 8b are formed. However, when the Cu plating layer 8b is formed, unevenness is intentionally made in the surface thereof to make its surface roughness large. Thereafter, the same steps as in the third embodiment are performed, for example, to form the resin layer 11 having the opening portion. Thus, a semiconductor package is completed.

In the tenth embodiment, the contacting area between the solder bump 10 and the Cu plating layer 8a is wider than that in the third embodiment. As a result, the bonding strength is heightened and the reliability is improved.

The solder bump 10 formed in these embodiments is connected mainly to a circuit board. By combining the circuit board with a periphery device and arranging the resultant in a box, an electronic device is made. The electronic device may be a mobile phone, a personal computer or the like. A part of the solder bumps 10 and the posts 7 may be formed only to disperse the stress in the whole of the semiconductor package uniformly. In this case, the solder bump 10 is not connected to the electrode 1a through the rerouting layer 2.

As the wafer, there can be used, for example, a compound semiconductor wafer made of GaAs, GaP, or the like, besides a Si wafer.

Industrial Applicability

As described in detail, according to the present invention, the flexible columnar resin material coated with the conductive layer is disposed and this portion acts as a post. Therefore, stress generated in this post can be uniformly dispersed mainly by the columnar resin material. For this reason, it is possible to make unnecessary a thick plating layer required for the post in the prior art and shorten production time and production steps. The height of the post can be controlled by the height of the columnar resin material. Accordingly, the adjustment thereof is easy.

Since the sealing resin layer formed on the wafer also functions as a surface protecting layer, it is possible to make unnecessary any resin-sealing step before mounting the bump such as a solder ball.

Furthermore, by using a laser to etch the resin layer, it is possible to incline the side surface of the resin layer remaining after the etching toward the surface thereof. Therefore, it is possible to make subsequent formation of the conductive layer easy.

What is claimed is:

1. A semiconductor package, comprising:
   an insulating layer formed on a wafer that is provided with an electrode;
   a rerouting layer penetrating through said insulating layer, the one end of said rerouting layer being connected to said electrode;
   a sealing resin layer which seals said wafer, said insulating layer and said rerouting layer;
   a columnar resin material which is defined by making a ring-like opening portion in a resin layer constituting said sealing resin layer and which is formed on said rerouting layer; and
   a conductive layer which is formed around said columnar resin material to cover said columnar resin material and which penetrates through said sealing resin layer to conduct electricity between a solder bump and the other end of said rerouting layer.

2. The semiconductor package according to claim 1, further comprising a resin layer formed on said sealing resin layer, said resin layer having an opening portion formed only on a portion of said conductive layer, said portion covering an upper surface of said columnar resin material.

3. The semiconductor package according to claim 1, further comprising a metal layer formed on said rerouting layer and at least at a position conformable to said ring-like opening portion, said metal layer having a higher reflectivity against a laser used when said ring-like opening portion is formed than said rerouting layer.

4. A semiconductor package, comprising:
   a wafer that is provided with an electrode; and
   a post formed on said wafer,
   wherein
   said post comprises a resin material and a conductive layer formed at least on an upper surface of said resin material,
   a spherical solder bump is formed on said conductive layer positioned on an upper surface of said post, and the central position of said solder bump is consistent with the central position of said post as are viewed in plan.

5. The semiconductor package according to claim 4, wherein said electrode and said conductive layer are connected to each other.

6. A semiconductor device provided with said semiconductor package according to claim 2, comprising
   an integrated circuit formed in said wafer.

7. An electronic device provided with said semiconductor device according to claim 6, comprising
   a circuit board connected to said solder bump.

8. A method for producing a semiconductor package, comprising the steps of:
   forming an insulating layer on a wafer that is provided with an electrode;
   forming a rerouting layer penetrating through said insulating layer, the one end of said rerouting layer being connected to said electrode;
   forming a sealing resin layer on the entire surface;
   making a ring-like opening portion reaching said rerouting layer in said sealing resin layer;
   forming a conductive layer from inside of said opening portion to upper side of said sealing resin layer, thereby making a shape that said sealing resin layer remaining inside said opening portion is covered with said conductive layer; and
   forming a solder bump on said conductive layer.

9. The method for producing a semiconductor package according to claim 8, wherein the step of making said opening portion is a step of using a laser to make said opening portion.

10. The method for producing a semiconductor package according to claim 8, wherein said sealing resin layer is composed of a photosensitive resin, and the step of making said opening portion is a step of making said opening portion by photolithography.

11. The semiconductor package according to claim 2, further comprising a metal layer formed on said rerouting layer and at least at a position conformable to said ring-like opening portion, said metal layer having a higher reflectivity against a laser used when said ring-like opening portion is formed than said rerouting layer.

12. A semiconductor device provided with said semiconductor package according to claim 2, comprising
   an integrated circuit formed in said wafer.

13. A semiconductor device provided with said semiconductor package according to claim 3, comprising
   an integrated circuit formed in said wafer.

14. A semiconductor device provided with said semiconductor package according to claim 4, comprising
   an integrated circuit formed in said wafer.

15. A semiconductor device provided with said semiconductor package according to claim 5, comprising
   an integrated circuit formed in said wafer.

* * * * *